United States Patent
Fehler et al.

(10) Patent No.: US 11,935,874 B2
(45) Date of Patent: Mar. 19, 2024

(54) CIRCUITRY AND METHOD OF FORMING A CIRCUITRY

(71) Applicant: Infineon Technologies AG, Neubiberg (DE)

(72) Inventors: Robert Fehler, Regensburg (DE); Sergey Yuferev, Villach (AT)

(73) Assignee: Infineon Technologies AG, Neubiberg (DE)

( * ) Notice: Subject to any disclaimer, the term of this patent is extended or adjusted under 35 U.S.C. 154(b) by 139 days.

(21) Appl. No.: 17/384,217

(22) Filed: Jul. 23, 2021

(65) Prior Publication Data
US 2022/0028840 A1 Jan. 27, 2022

(30) Foreign Application Priority Data
Jul. 24, 2020 (DE) .......................... 102020119611.3

(51) Int. Cl.
| | |
|---|---|
| *H01L 25/07* | (2006.01) |
| *H01L 21/56* | (2006.01) |
| *H01L 23/31* | (2006.01) |
| *H01L 23/64* | (2006.01) |
| *H01L 25/00* | (2006.01) |
| *H01L 25/18* | (2023.01) |

(52) U.S. Cl.
CPC ............ *H01L 25/072* (2013.01); *H01L 21/56* (2013.01); *H01L 23/3107* (2013.01); *H01L 23/642* (2013.01); *H01L 25/18* (2013.01); *H01L 25/50* (2013.01)

(58) Field of Classification Search
CPC ........... H01L 21/56; H01L 2224/04105; H01L 2224/06181; H01L 2224/2518; H01L 23/3107; H01L 23/3121; H01L 23/5389; H01L 23/642; H01L 24/20; H01L 25/072; H01L 25/18; H01L 25/50; H01L 2924/19041; H01L 2924/19105; H01L 2924/30107

See application file for complete search history.

(56) References Cited

U.S. PATENT DOCUMENTS

| | | | | |
|---|---|---|---|---|
| 8,975,711 B2 * | 3/2015 | Otremba | ............. | H01L 23/5389 257/401 |
| 9,496,168 B2 * | 11/2016 | Cho | ...................... | H01L 25/072 |
| 9,774,301 B1 * | 9/2017 | Maalouf | ........... | H01L 23/49838 |
| 10,903,180 B2 * | 1/2021 | Palm | ...................... | H01L 24/19 |

(Continued)

FOREIGN PATENT DOCUMENTS

| | | | | |
|---|---|---|---|---|
| CN | 205789962 U | * | 12/2016 | ......... H01L 23/4952 |
| DE | 102017215480 A1 | | 3/2018 | |
| DE | 102018216593 A1 | | 4/2020 | |

*Primary Examiner* — Telly D Green
(74) *Attorney, Agent, or Firm* — Murphy, Bilak & Homiller, PLLC

(57) ABSTRACT

A circuitry is provided. The circuitry may include a power stage including a first transistor and a second transistor, an encapsulation including encapsulation material encapsulating the power stage, wherein the first transistor and the second transistor are arranged in an L-shape with respect to each other along their long axes, and a passive electronic component arranged on or embedded within the encapsulation at least partially, in top view, within a rectangular area defined by the L-shape configuration and further next to the first transistor and next to the second transistor.

12 Claims, 13 Drawing Sheets

(56) References Cited

U.S. PATENT DOCUMENTS

| | | | |
|---|---|---|---|
| 2006/0113664 A1 | 6/2006 | Shiraishi et al. | |
| 2013/0146991 A1* | 6/2013 | Otremba | H01L 24/96 |
| | | | 438/109 |
| 2014/0003179 A1* | 1/2014 | Girdhar | H01L 23/49562 |
| | | | 327/109 |
| 2014/0070329 A1 | 3/2014 | Flores et al. | |
| 2014/0240945 A1 | 8/2014 | Hosseini et al. | |
| 2015/0001618 A1 | 1/2015 | Hebert | |
| 2015/0270249 A1* | 9/2015 | Cho | H01L 23/49575 |
| | | | 257/329 |
| 2016/0286654 A1 | 9/2016 | Romig et al. | |
| 2017/0345714 A1* | 11/2017 | Scharf | H01L 24/36 |
| 2018/0122745 A1* | 5/2018 | Cho | H01L 23/5389 |
| 2018/0233469 A1* | 8/2018 | Palm | H01L 23/5389 |
| 2019/0132983 A1* | 5/2019 | Weis | H01L 24/82 |
| 2020/0403617 A1* | 12/2020 | Lee | H03K 19/17728 |
| 2021/0050300 A1* | 2/2021 | Lin | H01L 23/5386 |
| 2021/0151428 A1* | 5/2021 | Dutta | H01L 23/481 |
| 2021/0194434 A1* | 6/2021 | Ladhani | H01L 23/66 |

\* cited by examiner 0.88 nH 0.29nH 0.70 nH 0.19 nH 0.29 nH

FIG. 6
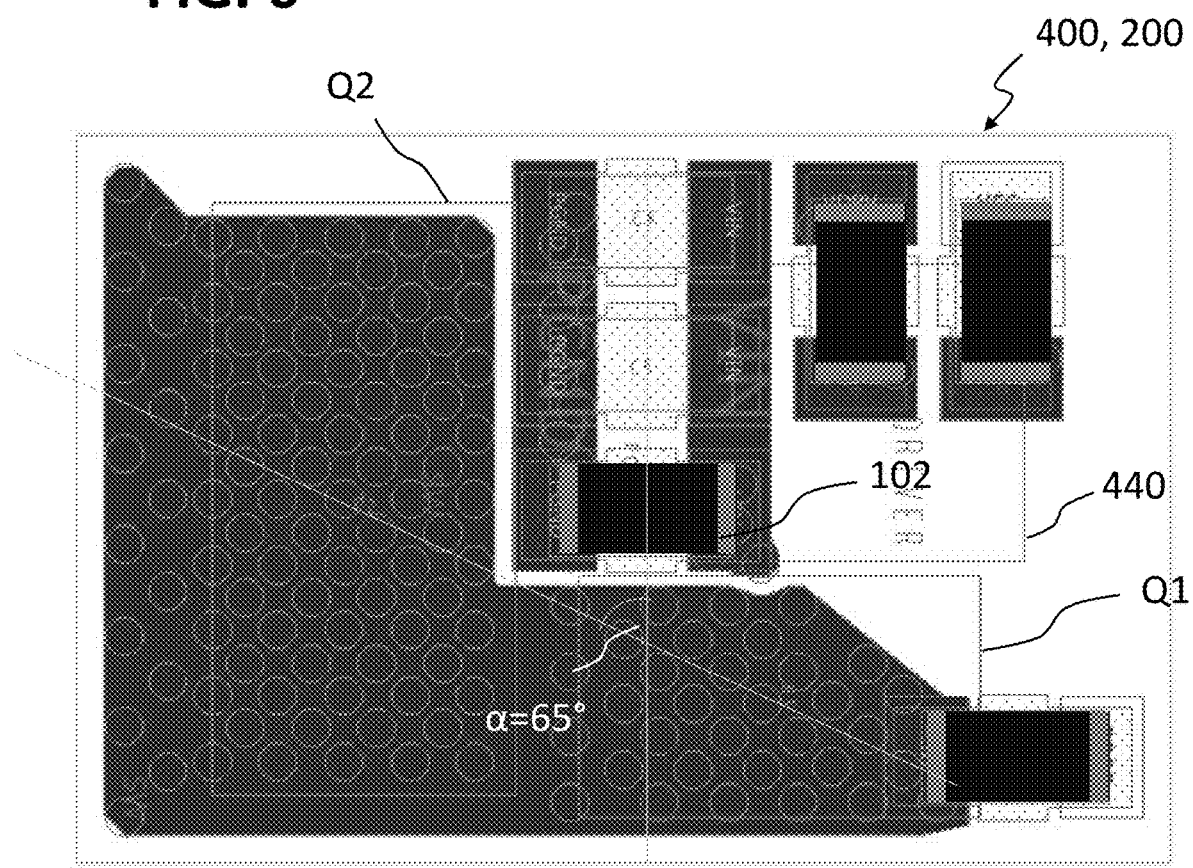
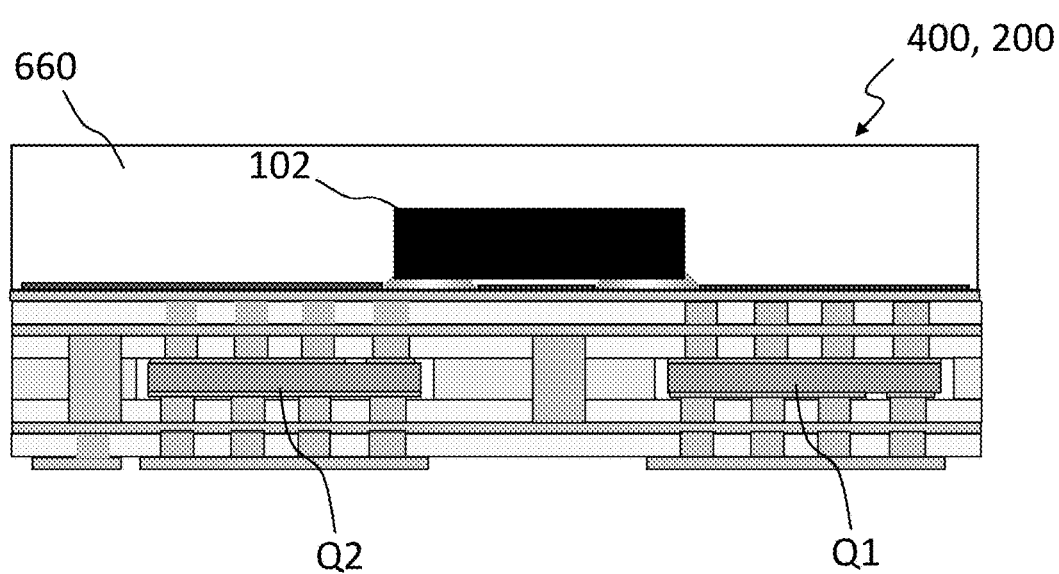

CIRCUITRY AND METHOD OF FORMING A CIRCUITRY

RELATED APPLICATIONS

This application claims priority to German patent application DE 102020119611.3 filed on Jul. 24, 2020, the content of which is incorporated by reference in its entirety.

TECHNICAL FIELD

Various embodiments relate generally to a circuitry and to a method of forming a circuitry.

BACKGROUND

Multi-die power stages and half-bridge packages like shown in FIG. 1A may be provided with a $V_{IN}$-GND capacitor for providing a current loop during a switching of transistors.

The loop may be characterized by a parasitic stray loop inductance value that is of critical importance for a safe operation of the power stage. High values of loop inductance may cause large amplitudes of drain-source voltage spikes during the switching of transistors that may lead to an undesired avalanche phenomenon.

Typically, the capacitor is mounted next to the package on a printed circuit board (PCB). In FIG. 1B, an example of such a circuit 101 including the package 100 with two transistors Q1, Q2 and the capacitor 102 mounted on the PCB 104 is shown. Due to large distances between the potentials that need to be stabilized and the capacitor pins, an impedance and an inductance of these connections may be high. Furthermore, an assembly pitch between each pair of a plurality of the power stages or half-bridges may be rather large, because the capacitors are located in-between the power stages.

SUMMARY

A circuitry is provided. The circuitry may include a power stage including a first transistor and a second transistor, an encapsulation including encapsulation material encapsulating the power stage, wherein the first transistor and the second transistor are arranged in an L-shape with respect to each other along their long axes, and a passive electronic component arranged on or embedded within the encapsulation at least partially, in top view, within a rectangular area defined by the L-shape configuration and further next to the first transistor and next to the second transistor.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings.

FIG. 6 schematically illustrates a circuitry in accordance with various embodiments in a top view and a cross-sectional view.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Various aspects of the disclosure are provided for devices, and various aspects of the disclosure are provided for methods. It will be understood that basic properties of the devices also hold for the methods and vice versa. Therefore, for sake of brevity, duplicate description of such properties may have been omitted.

A minimization of the loop inductance may directly depend on a position and orientation of the capacitor in the circuitry, which may include for example the multi-die power stage(s) and/or half-bridge package(s), which may be arranged on a printed circuit board (PCB).

In various embodiments, a circuitry is provided that has parasitic loop inductance values that are equal to or lower than parasitic loop inductance values for a regular assembly next to the package on the PCB. The external capacitors on the PCB may be removed. Thus, a circuitry with a reduced size is provided.

In various embodiments, a circuitry, e.g. including or consisting of multi-die power stages or half-bridge packages, is provided with an encapsulation (thereby forming a semiconductor package) and may integrate one or more capacitors on top of or embedded inside the encapsulation.

In various embodiments, the power stage may include two transistors that may be arranged in an L-shape, and a passive electronic component, for example a $V_{IN}$-GND capacitor with the above described functionality, may be arranged inside the L-shape, either in or on the encapsulation. In various embodiments, guidelines on an optimization of a position and orientation of the passive electronic component are provided.

In various embodiments, in a circuit, an enclosed loop area formed by a multi die half bridge (high side and low side die) and a capacitor, which may be connected to pads on both dies to stabilize the voltage between those pads, may be minimized. The enclosed loop area 550 is indicated in FIGS. 5C and 5E, and also in FIG. 5A showing an alternative configuration.

Figure 5A:
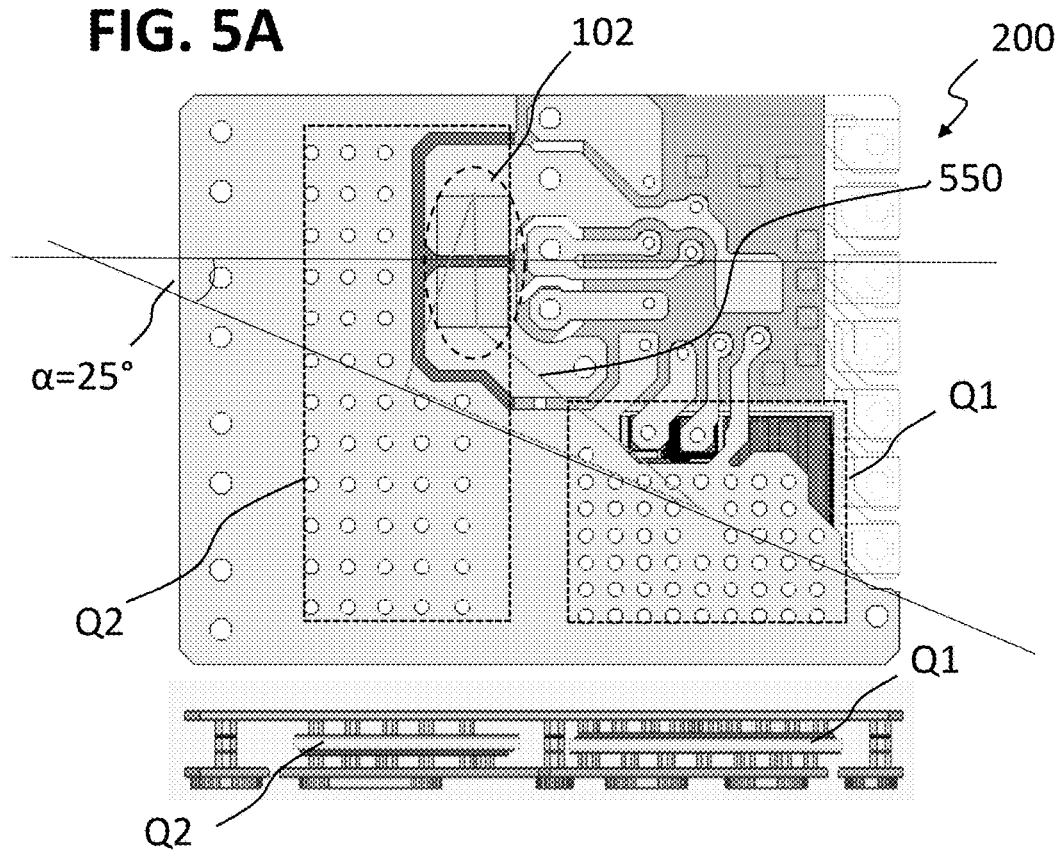
FIG. 5A schematically illustrates a circuitry with an alternative configuration.
Figure 5B:
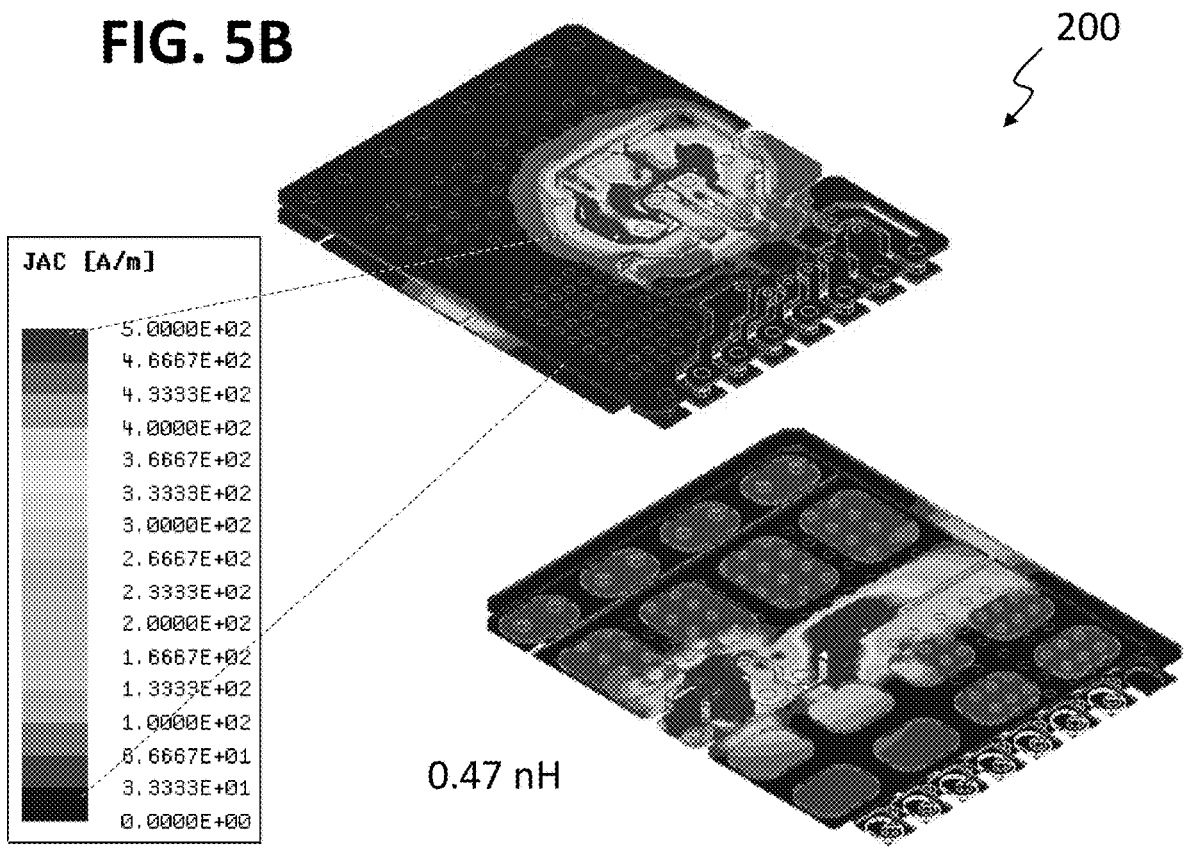
FIG. 5B visualizes a current density in the circuitry of FIG. 5A.
Figure 5C:
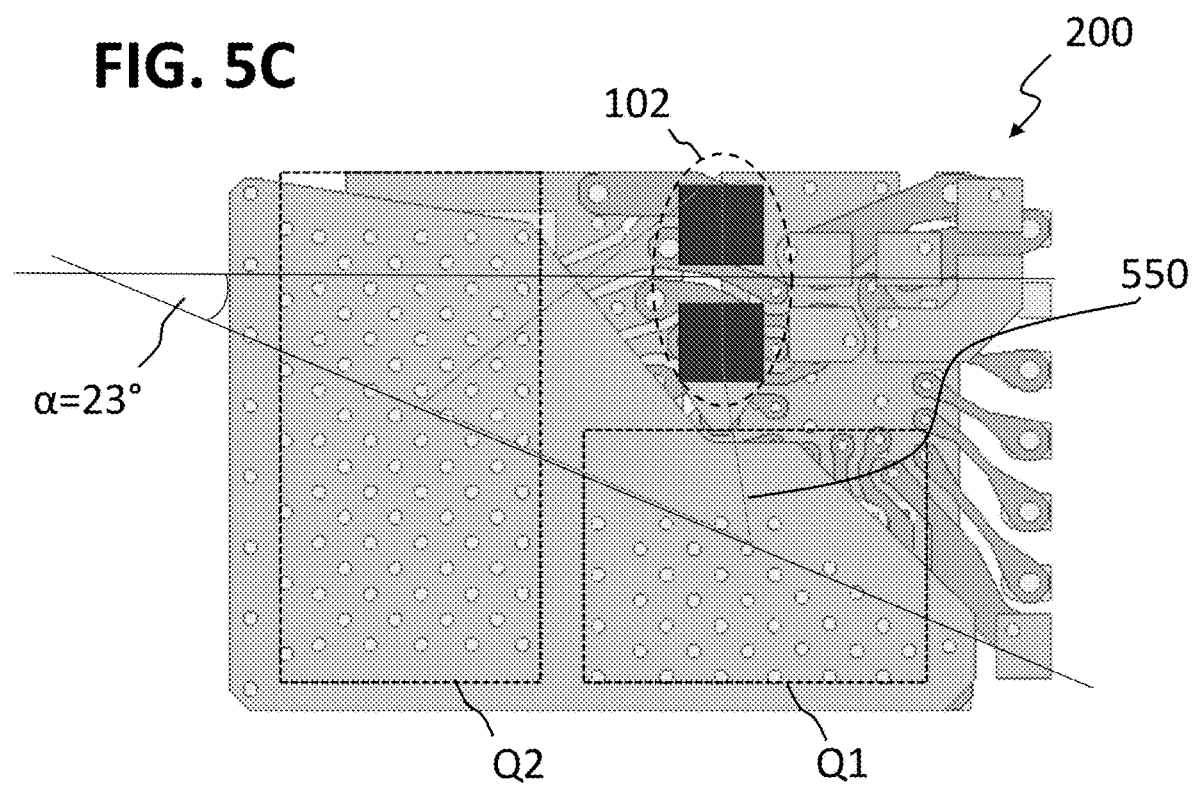
FIG. 5C schematically illustrates a circuitry in accordance with various embodiments.
Figure 5D:
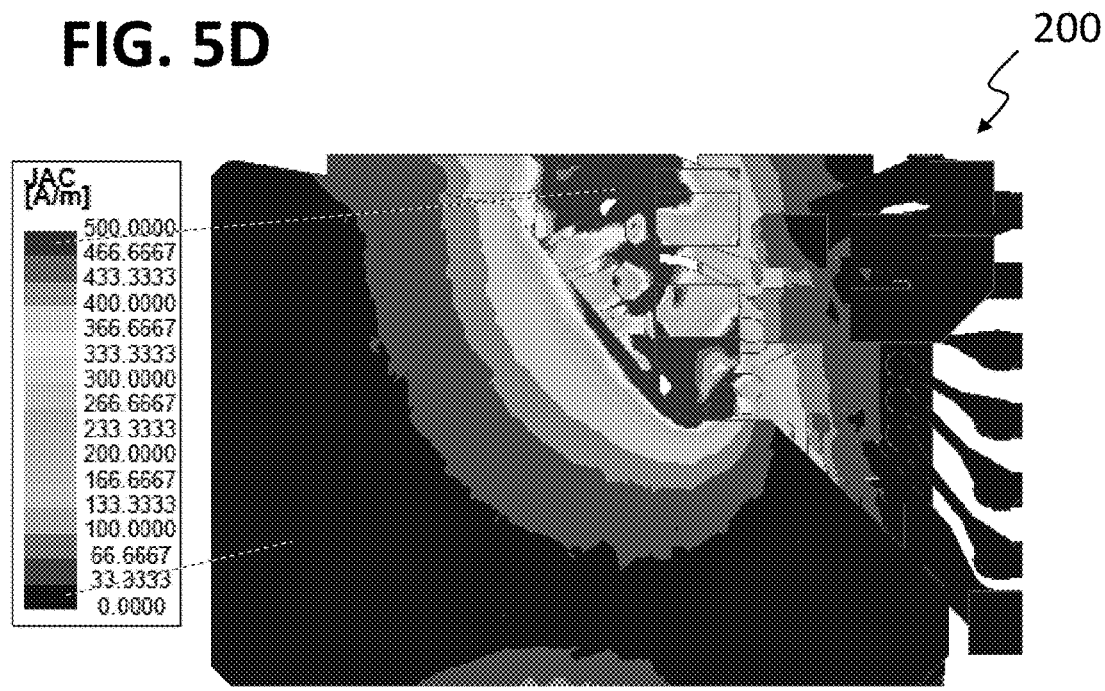
FIG. 5D visualizes a current density in the circuitry of FIG. 5C.
Figure 5E:
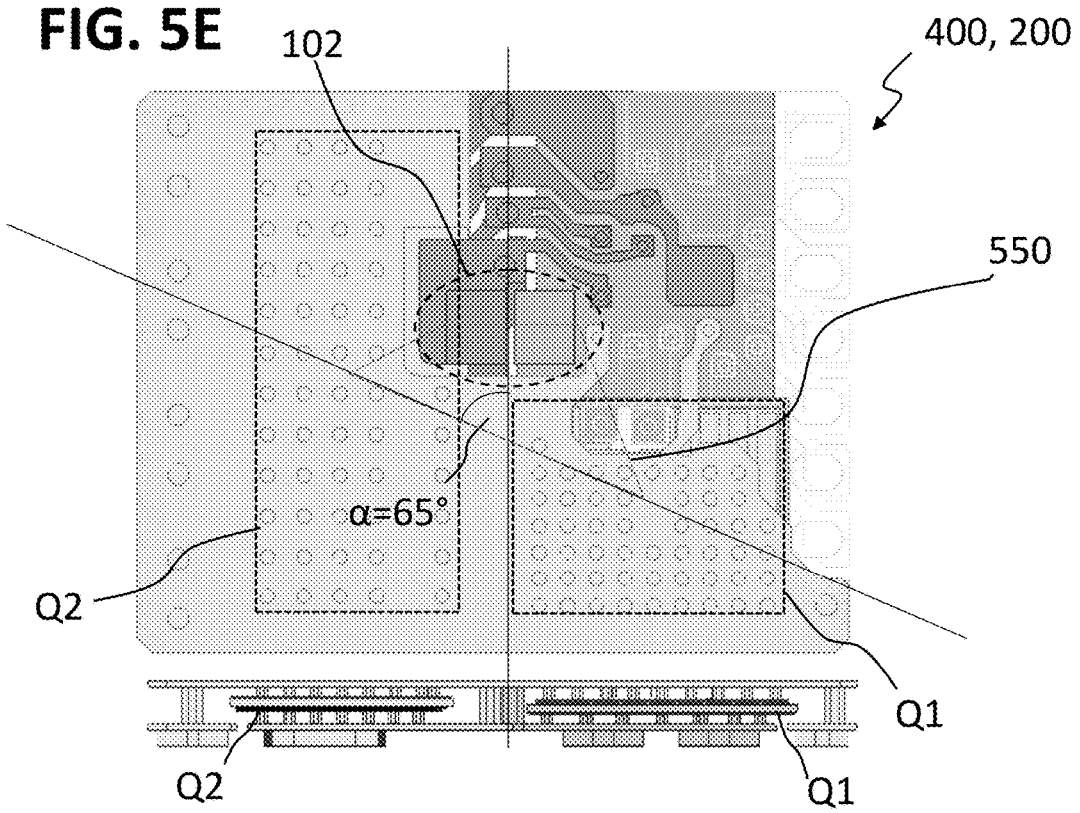
FIG. 5E schematically illustrates a circuitry in accordance with various embodiments.
Figure 5F:
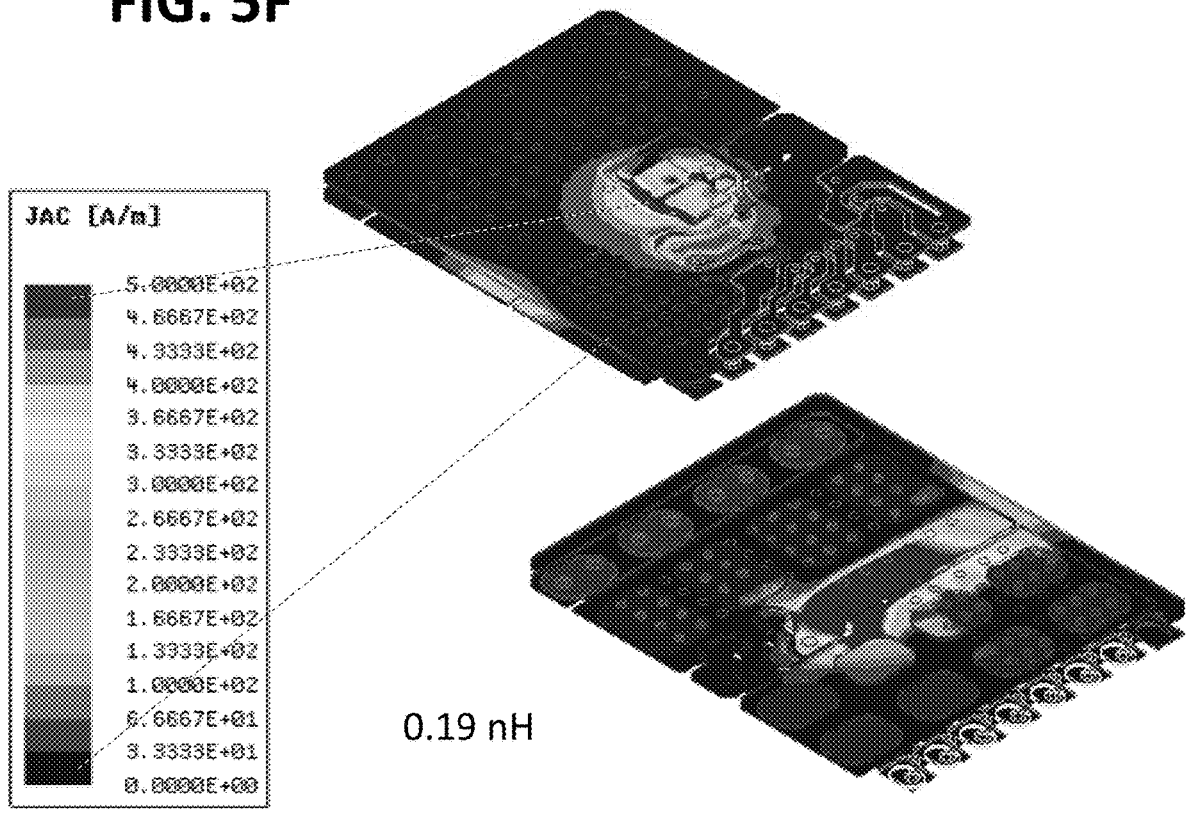
FIG. 5F visualizes a current density in the circuitry of FIG. 5E.
Figure 5G:
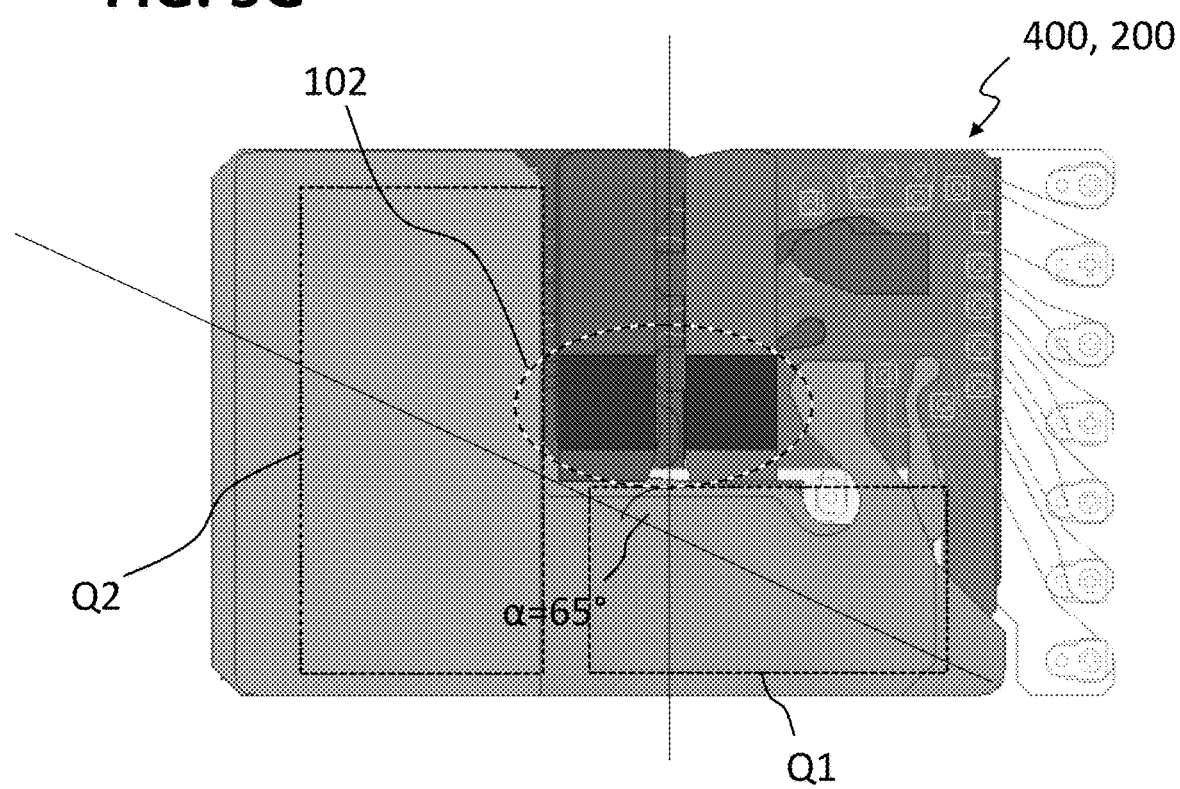
FIG. 5G schematically illustrates a circuitry in accordance with various embodiments.
Figure 5H:
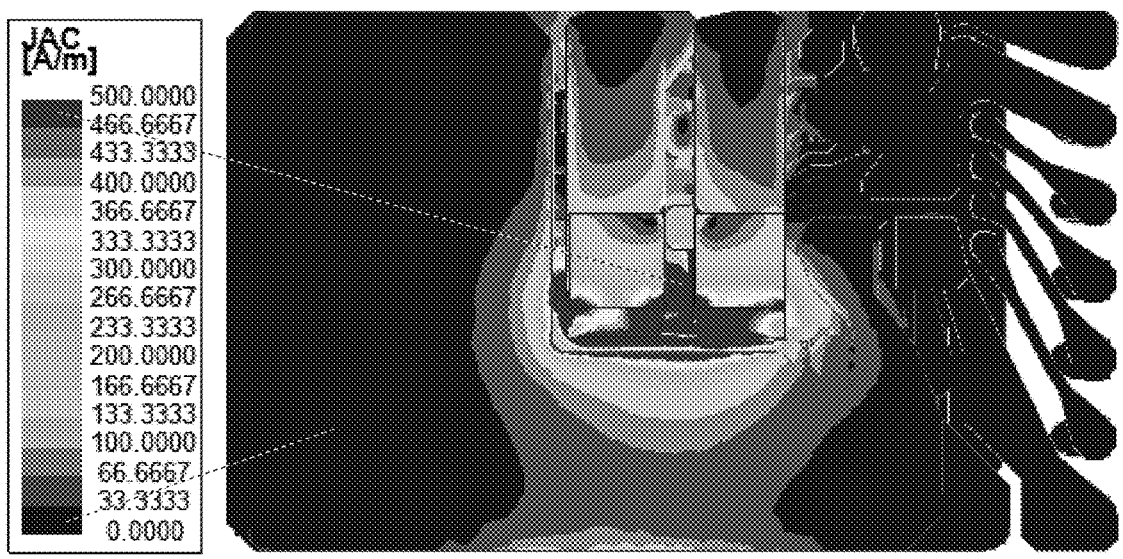
FIG. 5H visualizes a current density in the circuitry of FIG. 5G.

Each of FIGS. 2A to 2C, 3A, 3B, 4A to 4C, 5C, 5E, 5G, and 6 schematically illustrates a circuitry 200 according to various embodiments, or elements thereof, and FIG. 5A shows an alternative configuration.

Figure 2A:
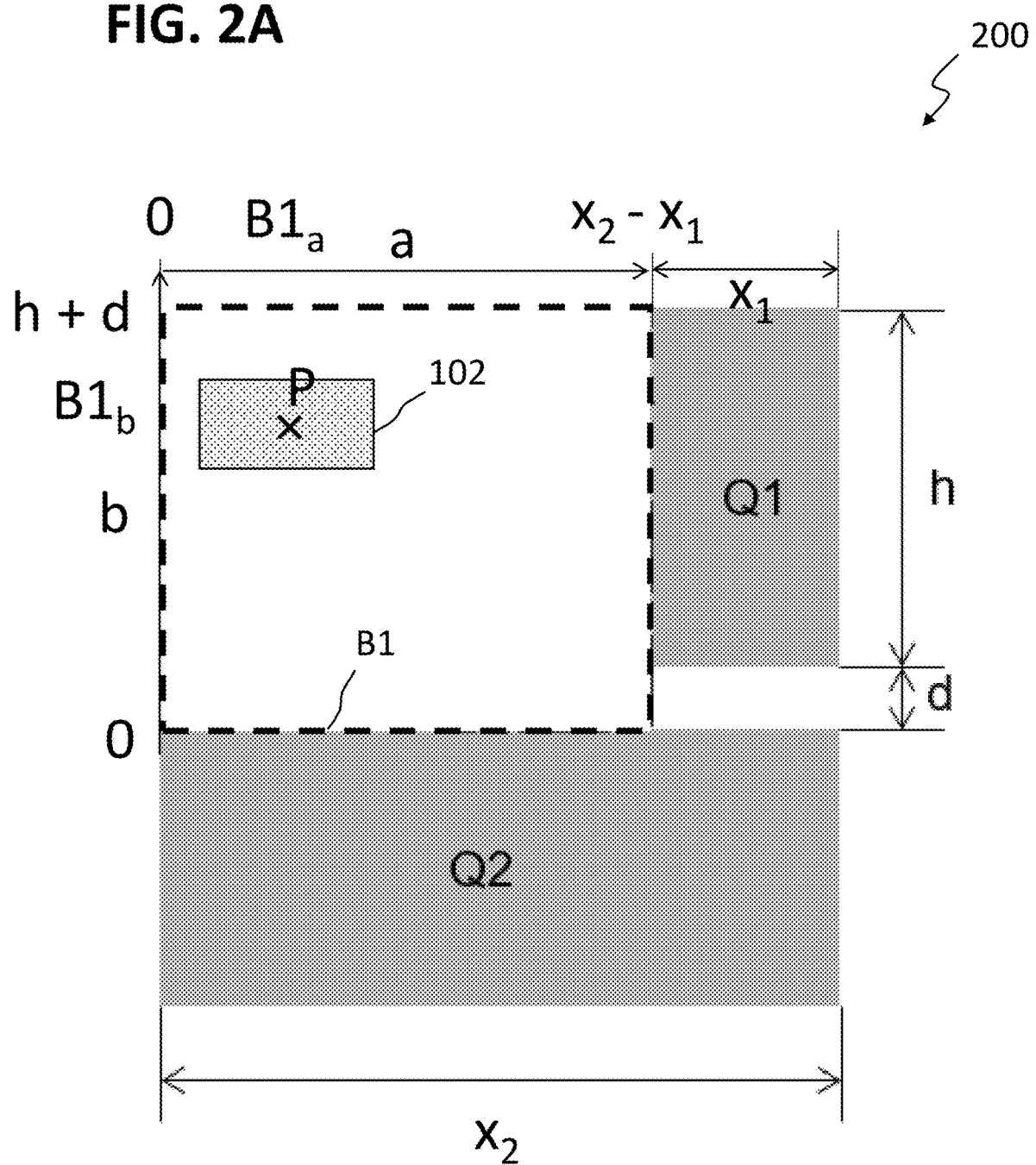
FIGS. 2A to 2C schematically illustrate elements of a circuitry according to various embodiments.
Figure 2B:
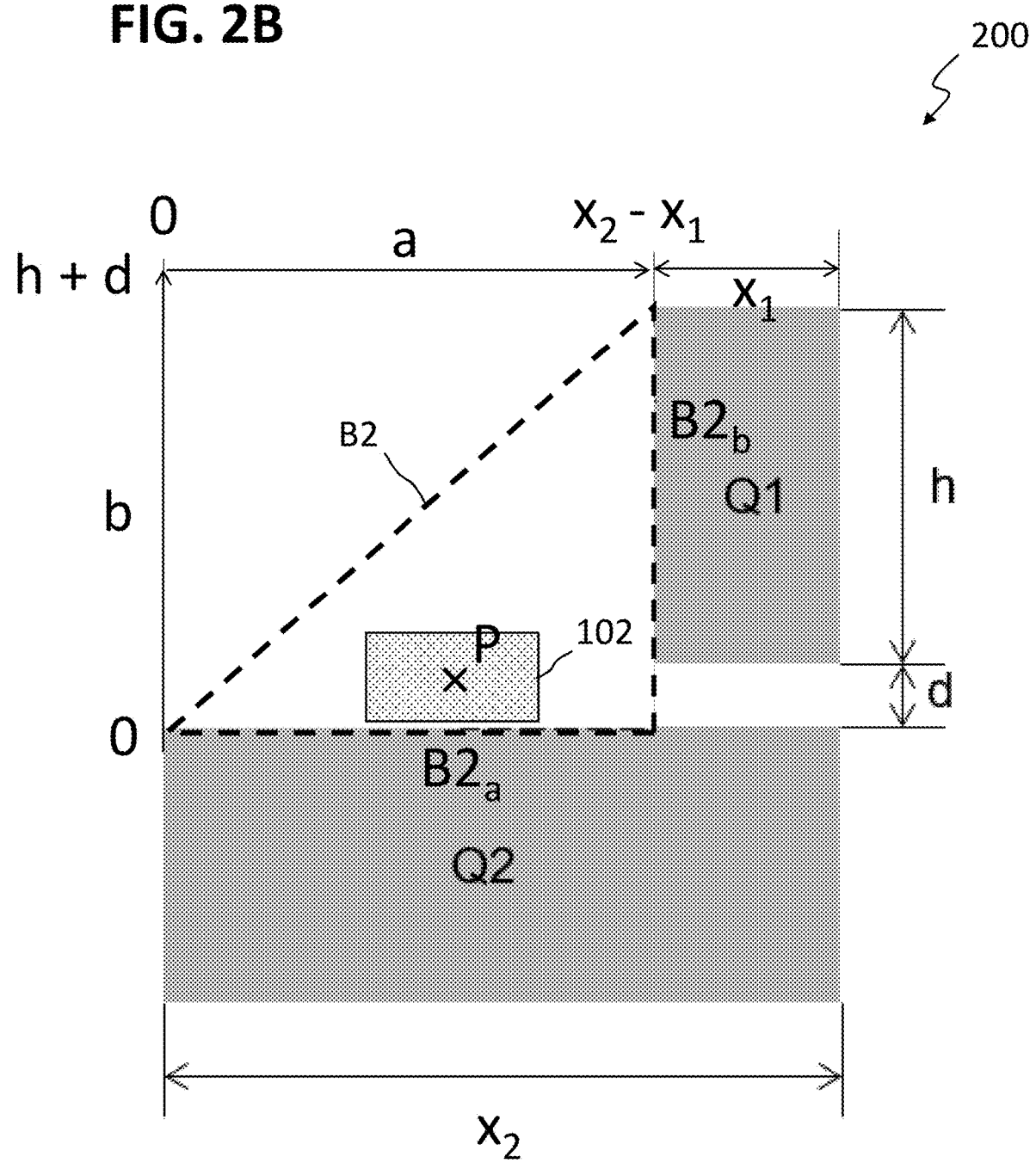
Figure 2C:
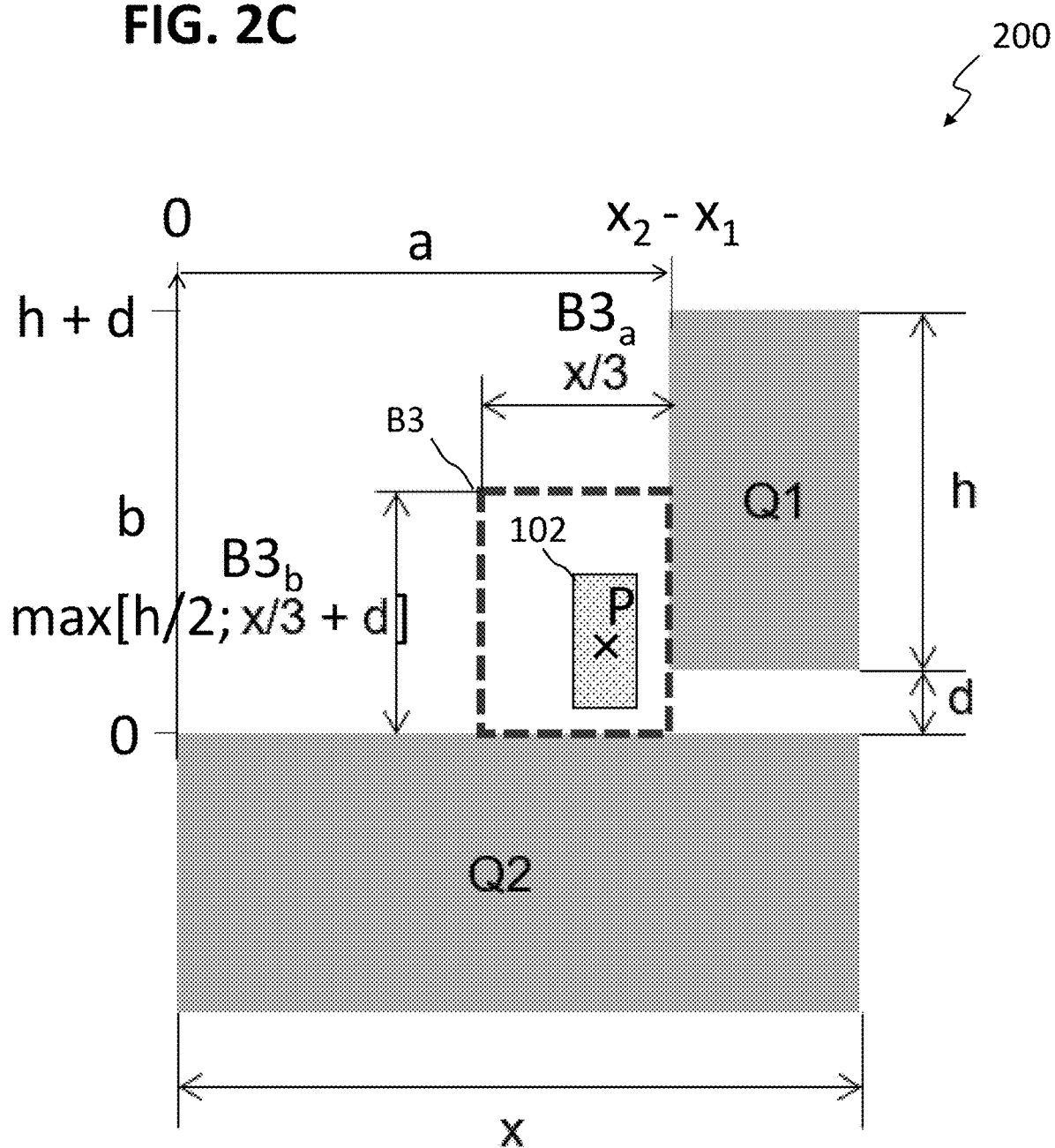

The circuitry 200 may include a power stage (which may operate in a common emitter mode, CE, or common source mode) including a first transistor Q1 and a second transistor Q2. The power stage may for example include a half-bridge circuit, wherein the first transistor Q1 may be a high side transistor of the half-bridge circuit, and the second transistor Q2 may be a low side transistor of the half-bridge circuit. The first transistor Q1 and the second transistor Q2 may be arranged in an L-shape with respect to each other along their long axes. This can be seen in all the figures in which the circuitry 200 is seen from the top and the first transistor Q1 and the second transistor Q2 are indicated. FIG. 2A to 2C indicate how dimensions and positions of elements of the circuitry 200 are referred to. The first transistor Q1 may be a high side transistor of the power stage, and the second transistor Q2 may be the low side transistor of the power stage.

The circuitry 200 may further include an encapsulation 660 including encapsulation material encapsulating the power stage. The encapsulation 660 is shown only in the cross-sectional view shown in FIG. 6 and is omitted in the other figures to avoid confusion.

The circuitry 200 may further include a passive electronic component 102 that may be arranged on or embedded within the encapsulation 660. The passive electronic component 102 may for example be a capacitor, for example, a $V_{IN}$-GND capacitor. In some of the figures, for example FIG. 2A to 2C, 4A to 4C, FIG. 6, the passive electronic component 102 is indicated as a single element, whereas in other figures, for example in FIGS. 3A and 3B, and in FIG. 5A to 5G, the passive electronic component 102 is indicated as a two-part element. The difference is that in one case, the passive electronic component 102 itself is represented as the single element, whereas in the other case, only its two contact pads are shown. Both representations are indicated with the reference number 102.

Even though most of the figures show many elements of the circuitry 200, like for example redistribution layers, vias, etc., only relevant elements and aspects, in particular relative positioning of the first transistor Q1, the second transistor Q2, and the passive electronic component 102, will be discussed herein. Apart from this, the circuitry 200 may be formed essentially as known in the art, for example from chip embedding technology.

The passive electronic component 102 may be arranged, at least partially within a rectangular area B1 (also referred to as rectangle B1) defined, in top view, by the L-shape configuration of the first transistor Q1 and the second transistor Q2. The rectangular area B1 may further be next to the first transistor Q1 and next to the second transistor B2. In other words, the rectangular area B1 may be the "inner" rectangular area of the L-shape, and may be directly adjacent to each of the transistors Q1 and Q2.

The (larger) rectangular area B1 may be defined as follows (see FIG. 2A): in a first direction a, the rectangular area B1 may be adjacent to an inner edge of the first transistor Q1 and may have a length $B1_a$ corresponding to a difference of a length $x_2$ of the long axis of the second transistor Q2 and a length $x_1$ of a short axis of the first transistor Q1, and in a second direction b, which may be orthogonal to the first direction a, the rectangle B1 may be adjacent to an inner edge of the second transistor Q2 and may have a length $B1_b$ corresponding to a sum of a separation d between the first transistor Q1 and the second transistor Q2 and a length h of the long axis of the first transistor Q1.

In the figures showing the embodiments, various options of positioning the passive electronic component 102, e.g. the $V_{IN}$-GND capacitor, are shown.

Figure 1A:
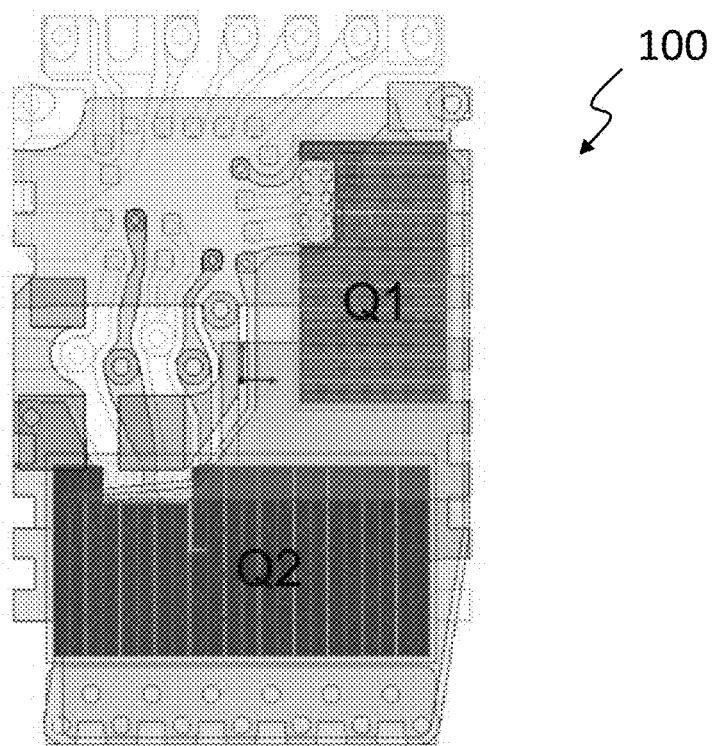
FIGS. 1A and FIG. 1B schematically illustrate a circuitry, with FIG. 1B showing a circuitry that includes a passive electronic component in an unoptimized position.
Figure 1B:
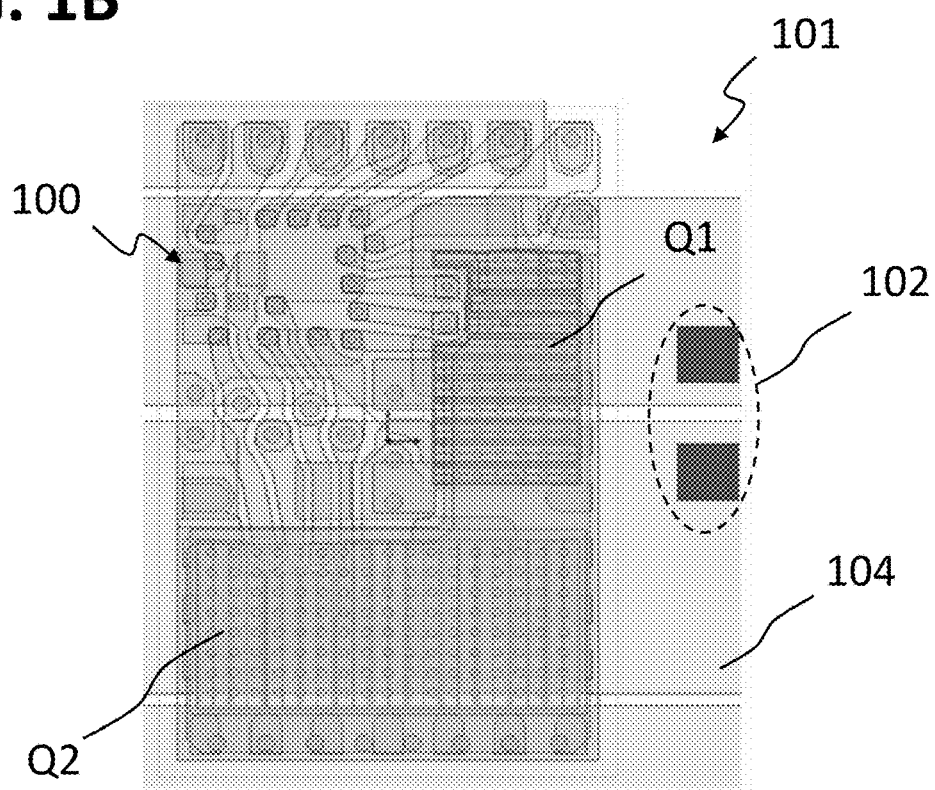

It is easily seen that positioning the passive electronic component 102, e.g. the capacitor 102, anywhere in the rectangular area B1 forms a more compact configuration than the prior art configuration of FIG. 1B. In other words, the prior art configuration of FIG. 1B requires more space of the PCB as compared with the embodiments, in which the passive electronic component 102, e.g. the capacitor, is embedded in the encapsulation 660 or arranged on the encapsulation 660 in the rectangular area B1. A loop inductance value may be improved over at least some of the prior art configurations.

In various embodiments, a position of the passive electronic component 102 may be further restricted within the rectangular area B1, for example to a triangular area B2 (also referred to as triangle B2) or to a (smaller) rectangular area B3 (also referred to as (smaller) rectangle B3), both of which may be fully included in the (larger) rectangular area B1. Thereby, a loop inductance value may be lowered, which may improve a performance of the circuitry 200.

In various embodiments, the triangular area B2 may be defined as follows (see FIG. 2B): in a first direction a, the triangular area B2 may be adjacent to an inner edge of the first transistor Q1 and may have a length $B2_a$ corresponding to a difference of a length $x_2$ of the long axis of the second transistor Q2 and a length $x_1$ of a short axis of the first transistor Q1 (in other words, the same length as the rectangular area B1).

In a second direction b, which may be orthogonal to the first direction a, the triangle B2 may be adjacent to an inner edge of the second transistor Q2 and may have a length $B2_b$ corresponding to a sum of a separation d between the first transistor Q1 and the second transistor Q2 and a length h of the long axis of the first transistor Q1 (in other words, the same length as the rectangular area B1). A hypothenuse of the triangular area B2 may be defined by joining an open end point of an edge of the triangle B2 in the first direction with an open end point of an edge of the triangle B2 in the second direction.

In other words, the triangular area B2 may be defined by the L-shape configuration and a line connecting an end of an inner edge of the first transistor Q1 that is furthest away from the second transistor Q2 and an end of an inner edge of the second transistor Q2 that is furthest away from the first transistor Q1.

In various embodiments, an orientation of the passive electronic component 102 of a circuitry 400 (which may otherwise include or consist of similar or identical components as the circuitry 200) may be restricted to a range of orientation angles α. The orientation angle α may be measured between a short axis of the passive electronic component 102 (wherein a long axis of the passive electronic component 102 extends through the centers of both contact pads of the passive electronic component 102, and the short axis is perpendicular to that) and a line connecting a geometric center of the first transistor Q1 with a geometric center of the second transistor Q2. In other words, the orientation angle α is an angle between a symmetry line along the short edge of the passive component 102 and a connection line crossing a top view center of the first transistor Q1 and a top view center of the second transistor Q2. The orientation angle α may in various embodiments be in a range from about 45° to about 135°. Thereby, a loop inductance value may be lowered, which may improve the performance of the circuitry 200.

In various embodiments, the passive electronic component 102 may be arranged with the orientation angle α in the range from about 45° to about 135° within the rectangular area B1, within the triangular area B2, or within the smaller rectangular area B3. Thereby, positive effects on the loop inductance value provided by the position and by the orientation of the passive electronic component 102 may be combined. The loop inductance may be lowest if the passive electronic component 102 is arranged in the smaller rectangular area B3 with the angle α between 45° and 135°.

Figure 3A:
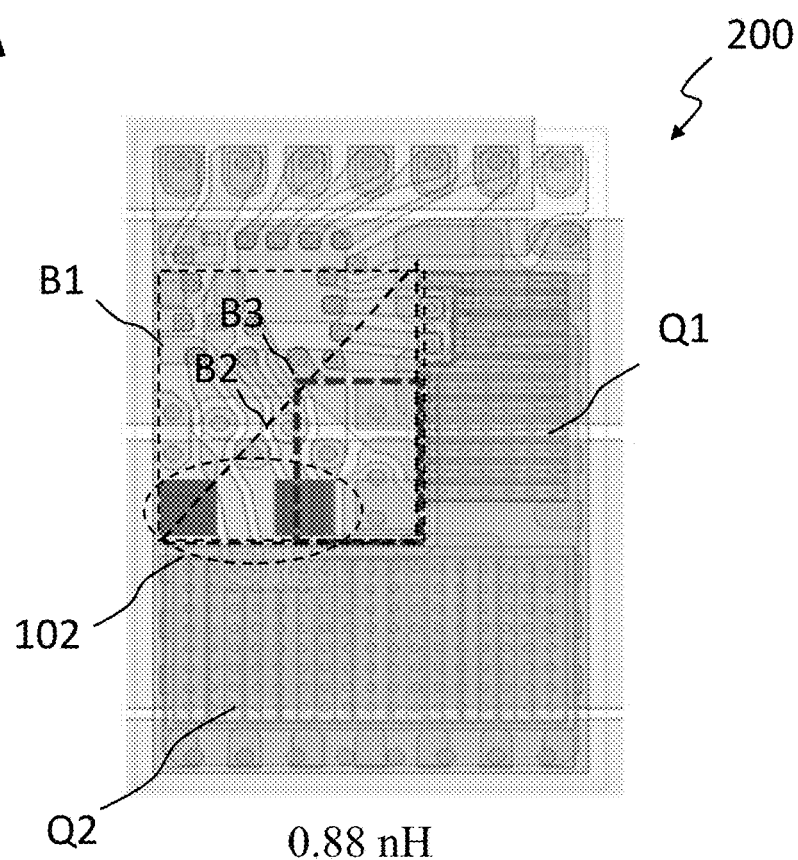
FIGS. 3A and 3B schematically illustrate a circuitry in accordance with various embodiments.
Figure 3B:
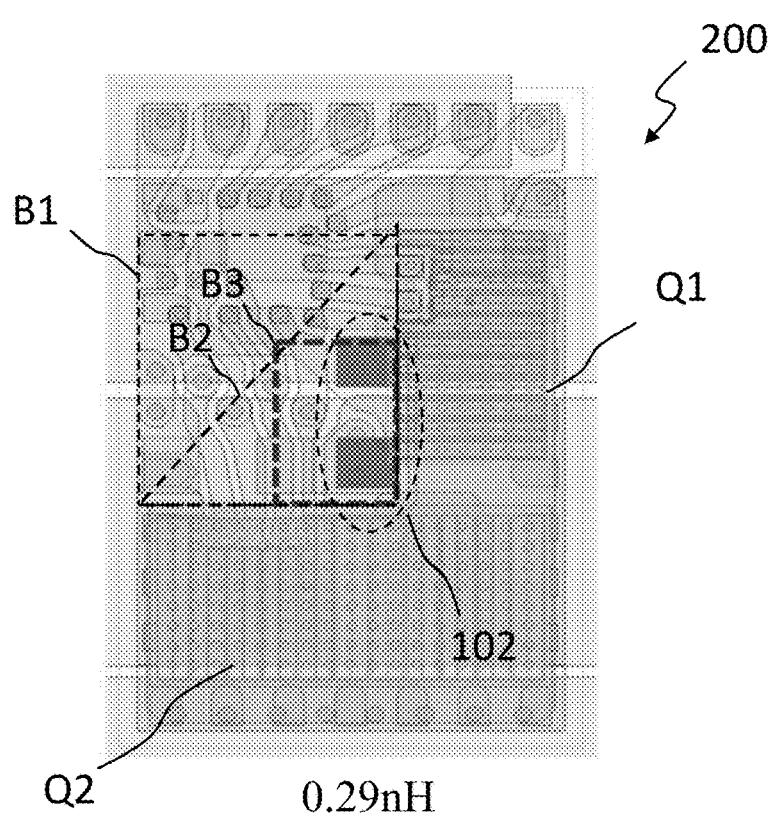
Figure 4A:
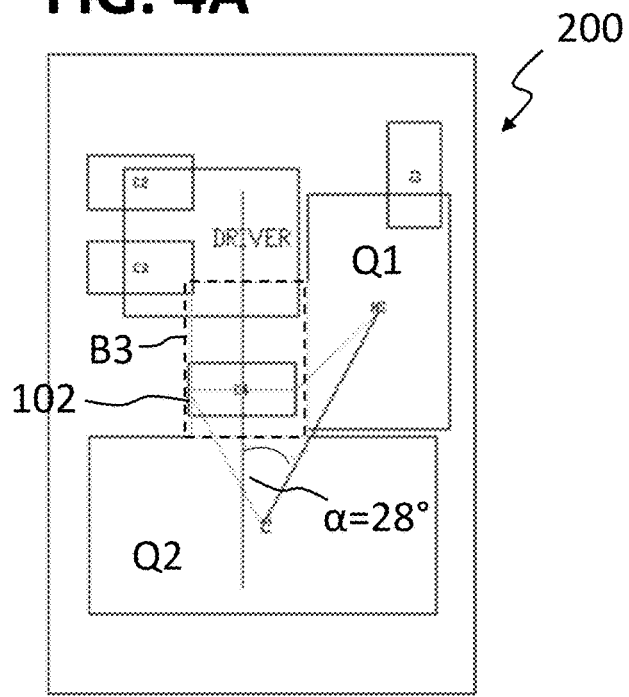
FIGS. 4A to 4C schematically illustrate a circuitry in accordance with various embodiments.
Figure 4B:
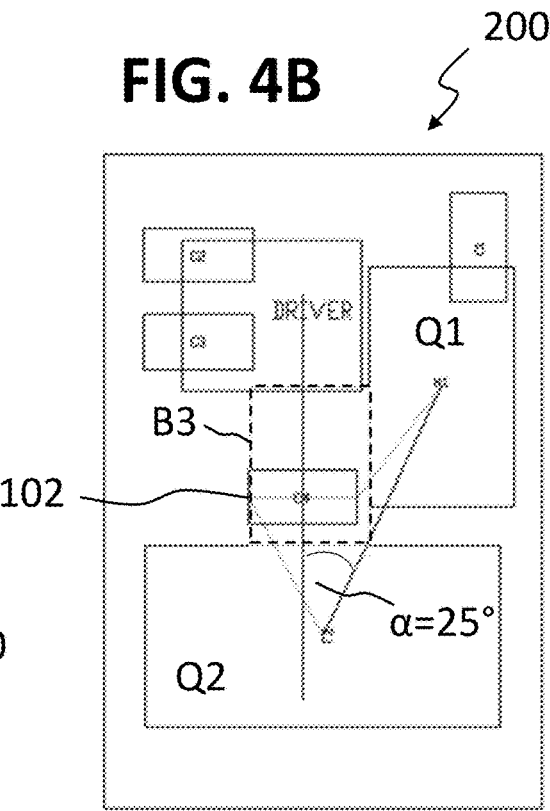
Figure 4C:
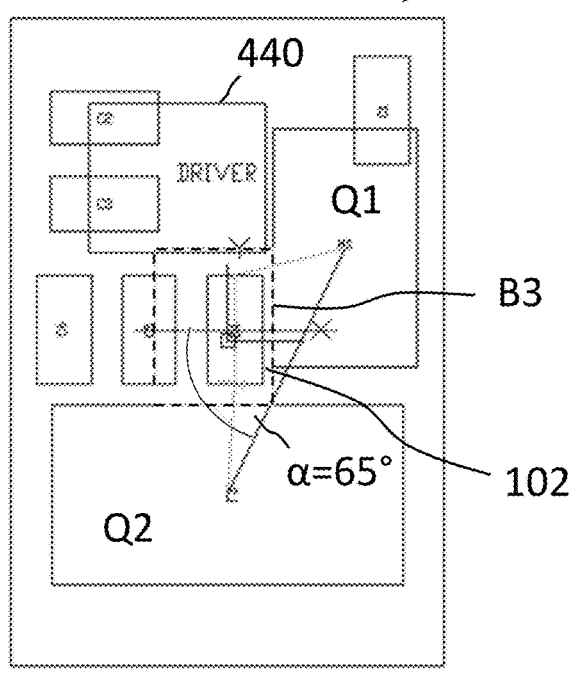

The loop inductance values for some of the configurations are indicated in some of the figures, for example in FIGS. 3A, 3B, 5A/5B, 5C/5D, 5E/5F, and 5G/5H, and they range from 0.19 nH for a configuration with most of the passive electronic component 102 arranged in the smaller rectangular area B3 and with an angle α=65° (FIG. 5E/5F), to 0.88 nH for a configuration with the passive electronic component 102 arranged partially inside the smaller rectangular area B3, but partially outside the triangular area B2, and with an angle α of about 25° (FIG. 3A; the angle α is not indicated in FIG. 3A to avoid crowding, but it is about the same as in FIG. 5A). A main reason for such a big difference between the loop inductance values may be due to different current paths and, consequently, different loop areas.

An effect of the loop area may be visualized by distributions of AC current densities in the circuitries 200, 400 during switching. Such visualizations are shown in FIGS. 5B, 5D, 5F, and 5H, in FIGS. 5B and 5E as perspective top- and bottom views. A comparison of the distributions shows that the embodiments with high loop inductance values cover a larger area with higher values.

In various embodiments, the (smaller) rectangular area B3 may be defined as follows (see FIG. 2C): in a first direction a, the rectangular area B3 may be adjacent to an inner edge of the first transistor Q1 and may have a length $B3_a$ of a third of the long axis of the second transistor Q2, and in a second direction b, which may be orthogonal to the first direction a, the rectangle B3 may be adjacent to an inner edge of the second transistor Q2 and may have a length $B3_b$ of a sum of a separation d between the first transistor Q1 and the second transistor Q2 and either a third of the long axis of the second transistor Q2 or half of the long axis of the first transistor Q1, whatever is larger (in other words, $B3_b$=max[h/2; x/3]+d.

Figure 7:
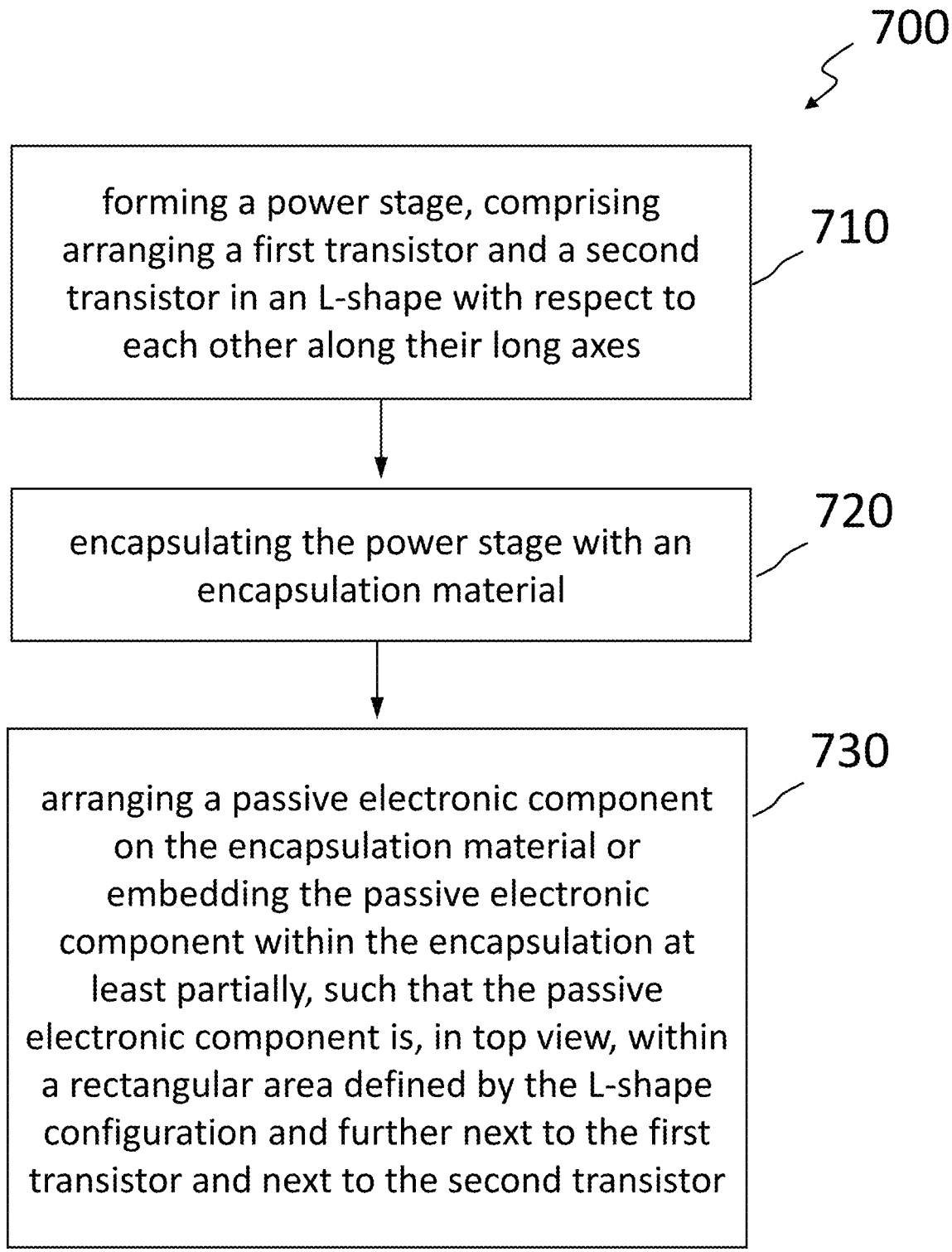
FIG. 7 shows a flow diagram of a method of forming a circuitry in accordance with various embodiments.

FIG. 7 shows a flow diagram 700 of a method of forming a circuitry in accordance with various embodiments.

The method may include forming a power stage, including arranging a first transistor and a second transistor in an L-shape with respect to each other along their long axes (in 710), encapsulating the power stage with an encapsulation material (in 720), and arranging a passive electronic component on the encapsulation material or embedding the passive electronic component within the encapsulation at least partially, such that the passive electronic component is, in top view, within a rectangular area defined by the L-shape configuration and further next to the first transistor and next to the second transistor (in 730).

Figure 8:
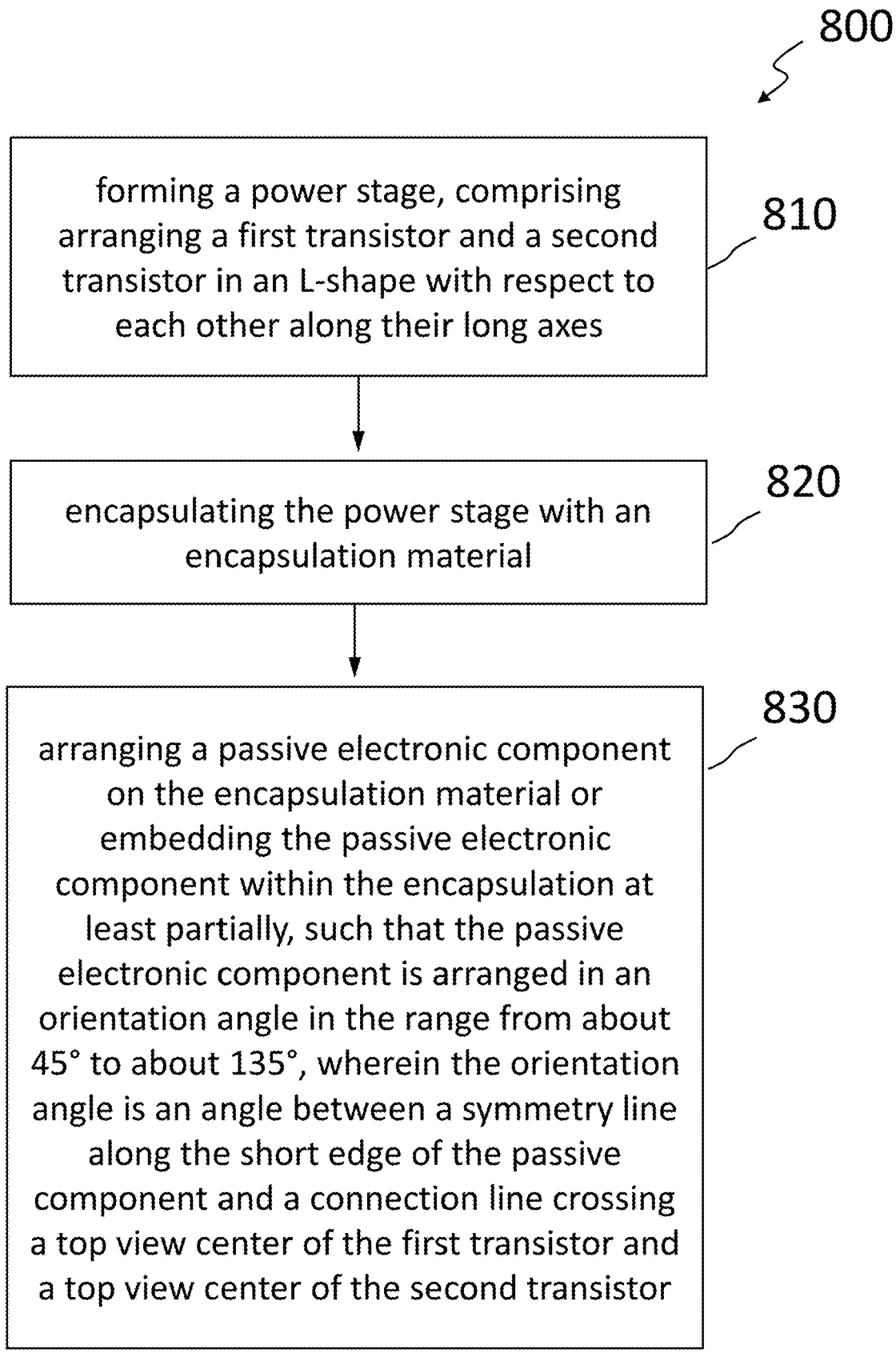
FIG. 8 shows a flow diagram of a method of forming a circuitry in accordance with various embodiments.

FIG. 8 shows a flow diagram 800 of a method of forming a circuitry in accordance with various embodiments.

The method may include forming a power stage, including arranging a first transistor and a second transistor in an L-shape with respect to each other along their long axes (in 810), encapsulating the power stage with an encapsulation material (in 820), and arranging a passive electronic component on the encapsulation material or embedding the passive electronic component within the encapsulation at least partially, such that the passive electronic component is arranged in an orientation angle in the range from about 45° to about 135°, wherein the orientation angle is an angle between a symmetry line along the short edge of the passive component and a connection line crossing a top view center of the first transistor and a top view center of the second transistor (in 830).

Various examples will be illustrated in the following:

Example 1 is a circuitry including a power stage including a first transistor and a second transistor, an encapsulation including encapsulation material encapsulating the power stage, wherein the first transistor and the second transistor are arranged in an L-shape with respect to each other along their long axes, and a passive electronic component arranged on or embedded within the encapsulation at least partially, in top view, within a rectangular area defined by the L-shape configuration and further next to the first transistor and next to the second transistor.

In Example 2, the subject-matter of Example 1 may optionally include that the passive electronic component is arranged in an orientation angle in the range from about 45° to about 135°, wherein the orientation angle is an angle between a symmetry line along the short edge of the passive component and a connection line crossing a top view center of the first transistor and a top view center of the second transistor.

In Example 3, the subject-matter of Example 1 or 2 may optionally include that the passive electronic component is completely arranged in the rectangular area.

Example 4 is a circuitry including a power stage including a first transistor and a second transistor, an encapsulation including encapsulation material encapsulating the power stage; wherein the first transistor and the second transistor are arranged in an L-shape with respect to each other along their long axes, and a passive electronic component arranged on or embedded within the encapsulation in an orientation angle in the range from about 45° to about 135°, wherein the orientation angle is an angle between a symmetry line along the short edge of the passive component and a connection line crossing a top view center of the first transistor and a top view center of the second transistor.

In Example 5, the subject-matter of Example 4 may optionally include that the passive electronic component is arranged, in top view, within a rectangular area defined by the L-shape configuration and further next to the first transistor and next to the second transistor In Example 6, the subject-matter of Example 5 may optionally include that the rectangular area is defined as follows: in a first direction, the rectangle is adjacent to an inner edge of the first transistor and has a length of a third of the long axis of the second transistor, and in a second direction orthogonal to the first direction, the rectangle is adjacent to an inner edge of the second transistor and has a length of a sum of a separation between the first transistor and the second transistor and either a third of the long axis of the second transistor or half of the long axis of the first transistor, whatever is larger.

In Example 7, the subject-matter of any of Examples 1 to 6 may optionally include that the passive electronic component is at least partially arranged in a triangular area defined by the L-shape configuration and a line connecting an end of an inner edge of the first transistor that is furthest away from the second transistor and an end of an inner edge of the second transistor that is furthest away from the first transistor.

In Example 8, the subject-matter of Example 7 may optionally include that the passive electronic component is completely arranged in the triangular area.

In Example 9, the subject-matter of any of Examples 1 to 8 may optionally include that the passive electronic component is a capacitor.

In Example 10, the subject-matter of any of Examples 1 to 9 may optionally include that the power stage includes a half-bridge circuit, wherein the first transistor is a high side transistor of the half-bridge circuit, and wherein the second transistor is a low side transistor of the half-bridge circuit.

In Example 11, the subject-matter of Example 10 may optionally include that the passive electronic component is electrically connected between a drain of the high side transistor and a source of the low side transistor.

In Example 12, the subject-matter of any of Examples 1 to 11 may optionally include that the first transistor and the second transistor are arranged by chip embedding technology.

In Example 13, the subject-matter of any of Examples 1 to 12 may optionally further include a driver circuit, wherein the passive electronic component is arranged laterally between the second transistor and the driver circuit in top view.

In Example 14, the subject-matter of any of Examples 1 to 13 may optionally include that a first transistor area covered by the first transistor is smaller than a second transistor area covered by the second transistor.

Example 15 is a method of forming a circuitry. The method may include forming a power stage, including arranging a first transistor and a second transistor in an L-shape with respect to each other along their long axes, encapsulating the power stage with an encapsulation material, and arranging a passive electronic component on the encapsulation material or embedding the passive electronic component within the encapsulation at least partially, such that the passive electronic component is, in top view, within a rectangular area defined by the L-shape configuration and further next to the first transistor and next to the second transistor.

In Example 16, the subject-matter of Example 15 may optionally include that the passive electronic component is arranged in an orientation angle in the range from about 45° to about 135°, wherein the orientation angle is an angle between a symmetry line along the short edge of the passive component and a connection line crossing a top view center of the first transistor and a top view center of the second transistor.

In Example 17, the subject-matter of Example 15 or 16 may optionally include that the passive electronic component is completely arranged in the rectangular area.

Example 18 is a method of forming a circuitry. The method may include forming a power stage, including arranging a first transistor and a second transistor in an L-shape with respect to each other along their long axes, encapsulating the power stage with an encapsulation material, and arranging a passive electronic component on the encapsulation material or embedding the passive electronic component within the encapsulation at least partially, such that the passive electronic component is arranged in an orientation angle in the range from about 45° to about 135°, wherein the orientation angle is an angle between a symmetry line along the short edge of the passive component and a connection line crossing a top view center of the first transistor and a top view center of the second transistor.

In Example 19, the subject-matter of Example 18 may optionally include that the passive electronic component is arranged, in top view, within a rectangular area defined by the L-shape configuration and further next to the first transistor and next to the second transistor.

In Example 20, the subject-matter of Example 19 may optionally include that the rectangular area is defined as follows: in a first direction, the rectangle is adjacent to an inner edge of the first transistor and has a length of a third of the long axis of the second transistor, and in a second direction orthogonal to the first direction, the rectangle is adjacent to an inner edge of the second transistor and has a length of a sum of a separation between the first transistor and the second transistor and either a third of the long axis of the second transistor or half of the long axis of the first transistor, whatever is larger.

In Example 21, the subject-matter of any of Examples 15 to 20 may optionally include that the passive electronic component is at least partially arranged in a triangular area defined by the L-shape configuration and a line connecting an end of an inner edge of the first transistor that is furthest away from the second transistor and an end of an inner edge of the second transistor that is furthest away from the first transistor.

In Example 22, the subject-matter of Example 21 may optionally include that the passive electronic component is completely arranged in the triangular area.

In Example 23, the subject-matter of any of Examples 15 to 22 may optionally include that the passive electronic component is a capacitor.

In Example 24, the subject-matter of any of Examples 15 to 23 may optionally include that the power stage includes a half-bridge circuit, wherein the first transistor is a high side transistor of the half-bridge circuit, and wherein the second transistor is a low side transistor of the half-bridge circuit.

In Example 25, the subject-matter of Example 24 may optionally include that the passive electronic component is electrically connected between a drain of the high side transistor and a source of the low side transistor.

In Example 26, the subject-matter of any of Examples 15 to 25 may optionally include that the forming the power stage includes embedding the first transistor and the second transistor.

In Example 27, the subject-matter of any of Examples 15 to 26 may optionally include arranging a driver circuit in such a way that the passive electronic component is arranged between the second transistor and the driver circuit.

In Example 28, the subject-matter of any of Examples 15 to 27 may optionally include that a first transistor area covered by the first transistor is smaller than a second transistor area covered by the second transistor.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A circuitry comprising:
a power stage comprising a first transistor and a second transistor;
an encapsulation comprising encapsulation material encapsulating the power stage;
wherein the first transistor and the second transistor are arranged in an L-shape with respect to each other along their long axes,
a passive electronic component arranged on or embedded within the encapsulation at least partially, in top view, within a rectangular area defined by the L-shape configuration and further next to the first transistor and next to the second transistor,
wherein the passive electronic component is completely arranged in the rectangular area.

2. The circuitry of claim 1,
wherein the passive electronic component is arranged in an orientation angle in the range from about 45° to about 135°, wherein the orientation angle is an angle between a symmetry line along the short edge of the passive component and a connection line crossing a top view center of the first transistor and a top view center of the second transistor.

3. A circuitry comprising:
a power stage comprising a first transistor and a second transistor;
encapsulation comprising encapsulation material encapsulating the power stage;
wherein the first transistor and the second transistor are arranged in an L-shape with respect to each other along their long axes,
a passive electronic component arranged on or embedded within the encapsulation in an orientation angle in the range from about 45° to about 135°, wherein the orientation angle is an angle between a symmetry line along the short edge of the passive component and a connection line crossing a top view center of the first transistor and a top view center of the second transistor,
wherein the passive electronic component is arranged, in top view, completely within a rectangular area defined by the L-shape configuration and further next to the first transistor and next to the second transistor.

4. The circuitry of claim 3,
wherein the rectangular area is defined as follows:

in a first direction, the rectangle is adjacent to an inner edge of the first transistor and has a length of a third of the long axis of the second transistor; and in a second direction orthogonal to the first direction, the rectangle is adjacent to an inner edge of the second transistor and has a length of a sum of a separation between the first transistor and the second transistor and either a third of the long axis of the second transistor or half of the long axis of the first transistor, whatever is larger.

5. The circuitry of claim 4,
wherein the passive electronic component is at least partially arranged in a triangular area defined by the L-shape configuration and a line connecting an end of an inner edge of the first transistor that is furthest away from the second transistor and an end of an inner edge of the second transistor that is furthest away from the first transistor.

6. The circuitry of claim 5,
wherein the passive electronic component is completely arranged in the triangular area.

7. The circuitry of claim 6,
wherein the passive electronic component is a capacitor.

8. The circuitry of claim 7,
wherein the power stage comprises a half-bridge circuit;
wherein the first transistor is a high side transistor of the half-bridge circuit; and
wherein the second transistor is a low side transistor of the half-bridge circuit.

9. The circuitry of claim 8,
wherein the passive electronic component is electrically connected between a drain of the high side transistor and a source of the low side transistor.

10. The circuitry of any of claim 9,
wherein the first transistor and the second transistor are arranged by chip embedding technology.

11. The circuitry of claim 10, further comprising:
a driver circuit,
wherein the passive electronic component is arranged laterally between the second transistor and the driver circuit in top view.

12. The circuitry of any of claim 11,
wherein a first transistor area covered by the first transistor is smaller than a second transistor area covered by the second transistor.

* * * * *

UNITED STATES PATENT AND TRADEMARK OFFICE
CERTIFICATE OF CORRECTION

PATENT NO. : 11,935,874 B2
APPLICATION NO. : 17/384217
DATED : March 19, 2024
INVENTOR(S) : R. Fehler et al.

It is certified that error appears in the above-identified patent and that said Letters Patent is hereby corrected as shown below:

In the Claims

Column 10, Line 35 (Claim 10) please change "of any of claim" to -- of claim --

Column 10, Line 42 (Claim 12) please change "of any of claim" to -- of claim --

Signed and Sealed this
Thirtieth Day of April, 2024

Katherine Kelly Vidal
*Director of the United States Patent and Trademark Office*